(12) United States Patent
Yuan et al.

(10) Patent No.: US 8,766,100 B2
(45) Date of Patent: Jul. 1, 2014

(54) PRINTED CIRCUIT BOARD AND SEMICONDUCTOR PACKAGE USING THE SAME

(75) Inventors: Qiu Yuan, Suzhou (CN); Du Maohua, Suzhou (CN); Huang Yucai, Suzhou (CN); Gu Liqun, Suzhou (CN)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 164 days.

(21) Appl. No.: 13/350,203

(22) Filed: Jan. 13, 2012

(65) Prior Publication Data
US 2012/0224335 A1  Sep. 6, 2012

(30) Foreign Application Priority Data

Mar. 2, 2011  (CN) .......................... 2011 1 0056450
Jul. 5, 2011  (KR) ........................ 10-2011-0066446

(51) Int. Cl.
*H05K 1/03*  (2006.01)
*H01L 23/31*  (2006.01)

(52) U.S. Cl.
CPC ................................. *H01L 23/3121* (2013.01)
USPC .......................................... 174/255; 174/260

(58) Field of Classification Search
CPC ................ H01L 2224/32225; H01L 2924/00; H01L 2224/48227; H01L 2224/73265; H01L 2924/0665; H01L 2924/00012; H01L 2224/131; H01L 2224/16225
USPC .......... 174/255, 257, 260; 361/760, 749, 767, 361/774; 257/676, 783, 787
See application file for complete search history.

(56) References Cited

U.S. PATENT DOCUMENTS

| | | | | |
|---|---|---|---|---|
| 5,336,931 A | * | 8/1994 | Juskey et al. | 257/787 |
| 5,397,917 A | * | 3/1995 | Ommen et al. | 257/698 |
| 6,498,392 B2 | * | 12/2002 | Azuma | 257/676 |
| 2004/0115862 A1 | * | 6/2004 | Kung et al. | 438/106 |
| 2009/0121362 A1 | * | 5/2009 | Jang | 257/782 |

FOREIGN PATENT DOCUMENTS

| | | | |
|---|---|---|---|
| JP | 07-111370 | | 4/1995 |
| JP | 2009-123843 | | 6/2009 |
| JP | 2009123843 | * | 6/2009 |
| KR | 10-0984132 | | 5/2009 |

* cited by examiner

*Primary Examiner* — Yuriy Semenenko
(74) *Attorney, Agent, or Firm* — F. Chau & Associates, LLC (57) ABSTRACT

A printed circuit board and a semiconductor package using the same. The semiconductor package includes a printed circuit board (PCB) and a semiconductor chip mounted on the PCB. The printed circuit board includes a base substrate that has a first surface and a second surface which are positioned opposite to each other, and has through-holes, the first surface having a concave-convex portion, an adhesive layer that is disposed on the second surface of the base substrate, a wiring layer that is attached to the second surface of the base substrate by the adhesive layer and that comprises exposed portions exposed through the through-holes, an adhesive member that is disposed on the first surface of the base substrate and adheres the semiconductor chip to the first surface, and electrical connection members that electrically connect the wiring layer with the semiconductor chip.

14 Claims, 10 Drawing Sheets

PRINTED CIRCUIT BOARD AND SEMICONDUCTOR PACKAGE USING THE SAME

CROSS-REFERENCE TO RELATED PATENT APPLICATIONS

This application claims the benefit of Chinese Patent Application No. 201110056450.9, filed on Mar. 2, 2011, in the Chinese Patent Office, and Korean Patent Application No. 10-2011-0066446, filed on Jul. 5, 2011, in the Korean Intellectual Property Office, the disclosures of which are incorporated herein in their entireties by reference.

BACKGROUND

The inventive concept relates to semiconductor technology, and more particularly, to a printed circuit board and a semiconductor package using the same.

As semiconductor devices are more highly integrated, there are more requirements for printed circuit boards (PCBs) in the semiconductor devices. Semiconductor chips are fixed to PCBs including metal wiring layers, overcoat layers and solder bumps on a substrate. A semiconductor chip is fixed to a printed circuit board by using an adhesive layer, which is bonded to the solder bumps. Conventional ways of fixing chips to PCBs have resulted in a complex PCB structure and low shear strength of a semiconductor chip. Accordingly, a less complex PCB structure for stably fixing the semiconductor chip, which also results in increased shear strength of the semiconductor chip, is required.

SUMMARY

According to an embodiment of the inventive concept, there is provided a semiconductor package including a printed circuit board, and a semiconductor chip mounted on the printed circuit board, wherein the printed circuit board includes a base substrate that includes a first surface and a second surface which are positioned opposite to each other, and includes through-holes, the first surface having a concave-convex portion, an adhesive layer that is disposed on the second surface of the base substrate, a wiring layer that is attached to the second surface of the base substrate by the adhesive layer and includes exposed portions exposed through the through-holes, an adhesive member that is disposed on the first surface of the base substrate and adheres the semiconductor chip to the first surface, and electrical connection members that electrically connect the wiring layer with the semiconductor chip.

In some embodiments of the inventive concept, the semiconductor package may further include pads that are disposed on the exposed portions of the wiring layer and are electrically connected to the electrical connection members.

In some embodiments of the inventive concept, the electrical connection members may be bonding wires that electrically connect the semiconductor chip with the pads. The electrical connection members may be plugs that are disposed on the pads and that fill in the through-holes. The pads may be plugs that fill in the through-holes. The electrical connection members may be solder balls that electrically connect the pads and the semiconductor chip.

In some embodiments of the inventive concept, the concave-convex portion may have a regular shape or an irregular shape. The concave-convex portion may have at least one of a triangular shape, a semicircular shape, a zigzag shape, a square wave shape, and a sine wave shape. The concave-convex portion may have a linear shape that extends in a direction. The concave-convex portion may have a mesh shape. The concave-convex portion may have an isolated island shape.

In some embodiments of the inventive concept, the adhesive member may cover at least a part of a side surface and a lower surface of the semiconductor chip.

In some embodiments of the inventive concept, the semiconductor package may further include a protective layer that covers the semiconductor chip and the electrical connection members.

In some embodiments of the inventive concept, the printed circuit board may be a flexible printed circuit board.

According to another embodiment of the inventive concept, there is provided a printed circuit board including a base substrate that includes a first surface and a second surface which are positioned opposite to each other, and includes through-holes, the first surface having a concave-convex portion, an adhesive layer that is disposed on the second surface of the base substrate, a wiring layer that is attached to the second surface of the base substrate by using the adhesive layer and includes exposed portions exposed through the through-holes, and pads that are disposed on the exposed portions of the wiring layer.

A method of manufacturing a semiconductor package, in accordance with an embodiment of the inventive concept, comprises forming a concave-convex portion on a first surface of the base substrate, forming an adhesive layer on a second surface of the base substrate opposite to the first surface, forming through-holes through the base substrate and the adhesive layer, forming a wiring layer on the adhesive layer, the wiring layer having exposed portions exposed through the through-holes, and mounting a semiconductor chip on the concave-convex portion by using an adhesive member, wherein the adhesive member fills in concave regions of the concave-convex portion.

The method may further comprise flowing the adhesive member along the concave-convex portion to fill in the concave regions.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Reference will now be made in detail to exemplary embodiments, examples of which are illustrated in the accompanying drawings. However, exemplary embodiments are not limited to the embodiments illustrated hereinafter. In the drawings, the thicknesses of layers and regions may be exaggerated for clarity.

It will be understood that when an element, such as a layer, a region, or a substrate, is referred to as being "on," "connected to" or "coupled to" another element, it may be directly on, connected or coupled to the other element or intervening elements may be present. Like reference numerals may refer to like elements throughout. As used herein, the term "and/or" includes any and all combinations of one or more of the associated listed items.

Figure 1:
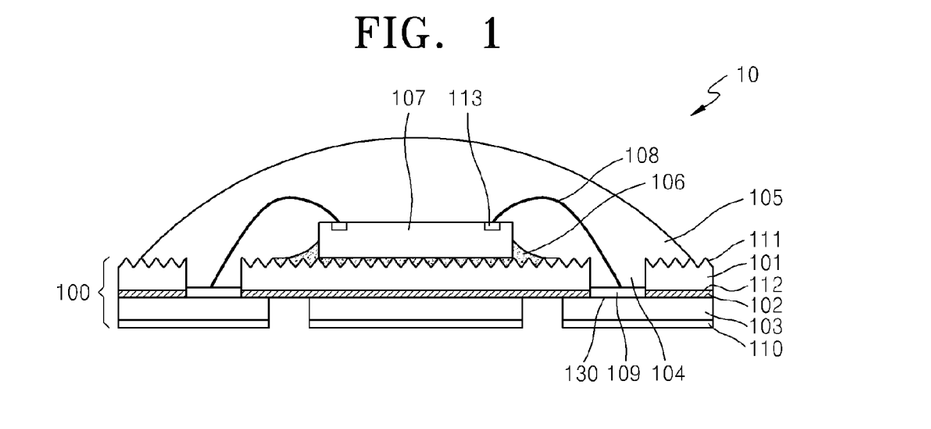
FIG. 1 is a cross-sectional view illustrating a semiconductor package according to an embodiment of the inventive concept.

FIG. 1 is a cross-sectional view illustrating a semiconductor package 10 according to an embodiment of the inventive concept.

Referring to FIG. 1, the semiconductor package 10 includes a printed circuit board (PCB) 100 and a semiconductor chip 107 mounted on the PCB 100.

In accordance with an embodiment of the inventive concept, the PCB 100 includes glass, ceramic, or plastic. The PCB 100 may be, for example, a substrate for semiconductor packages, or a flexible PCB (FPCB) such as a tape substrate.

The PCB 100 includes a base substrate 101, an adhesive layer 102, a wiring layer 103, pads 109, and contact pins 110.

The base substrate 101 includes a first surface 111 and a second surface 112 which are opposite to each other. The semiconductor chip 107 is mounted on the first surface 111 of the base substrate 101, and a member for providing electrical connection to an external device is disposed on the second surface 112 of the base substrate 101.

The base substrate 101, in accordance with an embodiment of the inventive concept, includes an insulating material, for example, polyethylene naphthalate (PEN), polyethylene terephthalate (PET), or polyimide.

In accordance with an embodiment of the inventive concept, the first surface 111 of the base substrate 101 has a concave-convex portion, for example, a scratched portion. The second surface 112 of the base substrate 101 is a smooth, or has a concave-convex portion like the first surface 111. In accordance with an embodiment of the inventive concept, the concave-convex portion has a zigzag shape, but the present embodiment is not limited thereto. For example, the concave-convex portion may have a regular shape or an irregular shape. Also, the concave-convex portion may include triangular, square shape, or semicircular shaped concave-convex parts. For example, the concave-convex portion may have a square wave shape and/or a sine wave shape. The concave-convex portion is explained in further detail with reference to FIGS. 11 through 16.

The adhesive layer 102 and the wiring layer 103 are disposed on the second surface 112 of the base substrate 101. The adhesive layer 102 is disposed between the base substrate 101 and the wiring layer 103 to attach the base substrate 101 and the wiring layer 103 to each other.

The adhesive layer 102 includes, for example, a material having high thermal conductivity and high adhesive force, for example, epoxy resin, a curing material, or a filler material.

The wiring layer 103 includes a conductive material, for example, a metal. The wiring layer 103 includes at least one of, for example, aluminum (Al), copper (Cu), gold (Au), beryllium (Be), bismuth (Bi), cobalt (Co), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), thallium (Te), titanium (Ti), tungsten (W), zinc (Zn), and zirconium (Zr). The wiring layer 103 may have a multi-layer structure including, for example, metal layer/resin layer/metal layer, and may be, for example, a copper clad laminate (CCL) layer. Alternatively, the wiring layer 103 may be a tape automated bonding (TAB) tape with a metal line formed thereon. In accordance with an embodiment of the inventive concept, the wiring layer 103 includes a material suitable for a wiring bonding process such as a stitch bonding process.

The wiring layer 103 includes exposed portions 130 exposed through through-holes 104. The through-holes 104 pass through the base substrate 101 and the adhesive layer 102. The pads 109 are disposed on the exposed portions 130, and are exposed through the through-holes 104. The pads 109 are disposed on a surface of the wiring layer 103 close to the base substrate 101. The pads 109 provide electrical connection to the semiconductor chip 107. The pads 109 include a conductive material, for example, a metal, and may include a material used to form the wiring layer 103.

The contact pins 110 are disposed on another surface of the wiring layer 103 opposite to the surface on which the adhesive layer 102 and the pads 109 are disposed. In other words, the contact pins 110 are disposed on a surface of the wiring layer 103 opposite to the surface on which the base substrate 101 is disposed. The contact pins 110 provide electrical connection to an external device. The contact pins 110 have an appropriate pattern shape.

The semiconductor chip 107 is disposed on the PCB 100. In more detail, the semiconductor chip 107 is attached to the first surface 111 of the base substrate 101 by using the adhesive member 106. As described above, since the first surface 111 has a concave-convex portion, a larger contact area than that of a smooth surface is provided between the base substrate 101 and the adhesive member 106. The larger contact area increases a contact strength between the base substrate 101 and the semiconductor chip 107, and enables the semiconductor chip 107 to be attached to the base substrate 101 with a greater resistance to shear forces that may be generated, for example, during a wire bonding process.

The adhesive member 106 includes a material having high thermal conductivity and adhesive force, for example, epoxy resin or a curing material. The adhesive member 106 is disposed under the semiconductor chip 107, and to this end, has fluidity and/or curability. Also, according to an embodiment of the inventive concept, the adhesive member 106 covers at least a part of a side surface of the semiconductor chip 107. The adhesive member 106 covers at least a part of the first surface 111 of the base substrate 101.

According to an embodiment of the inventive concept, the adhesive member 106 includes a filler material. The filler material fills in the concave-convex portion of the first surface 111. For example, a height and/or a width of the concave-convex portion may be equal to or similar to a height and/or a width of the filler material. According to an embodiment, the filler material is introduced into a recessed portion of the concave-convex portion, thereby increasing a contact area and an adhesive force.

The semiconductor chip 107 may be, for example, a logic semiconductor chip or a memory semiconductor chip. The logic semiconductor chip may be a microprocessor, for example, a central processing unit (CPU), a controller, or an application specific integrated circuit (ASIC). Also, the memory semiconductor chip may be a volatile memory, such as, for example, a dynamic random access memory (DRAM) or a static random access memory (SRAM), or a nonvolatile memory such as a flash memory. Also, a plurality of the semiconductor chips 107 may be used and may be stacked.

The semiconductor chip 107 is electrically connected to the wiring layer 103 through electrical connection members 108. Referring to FIG. 1, the electrical connection members 108 electrically connect the pads 109 of the PCB 100 and chip pads 113 disposed in upper portions of the semiconductor chip 107. In accordance with an embodiment of the inventive concept, the electrical connection members 108 are bonding wires, but are not limited thereto.

In order to prevent damage to the semiconductor chip 107 and/or the electrical connection members 108 and dissipate heat, a protective layer 105 is disposed to cover the semiconductor chip 107 and/or the electrical connection members 108. The protective layer 105 also covers the first surface 111 of the base substrate 101.

Since the semiconductor package 10 of FIG. 1 includes the PCB 100 including the base substrate 101 having the concave-convex portion formed on a surface thereof, and the semiconductor chip 107 is attached to the base substrate 101 by using the adhesive member 106 disposed on the concave-convex portion, the semiconductor chip 107 is stably attached to the PCB 100. Such stability allows a wire bonding process for electrical connection between a semiconductor chip and a thin PCB, such as a flexible PCB (FPCB). Also, an overcoat layer which is used in a conventional semiconductor package may not be required. As a result, according to the present embodiment, structures of the PCB 100 and the semiconductor package 10 are simplified, and technology for a package process is expanded.

FIGS. 2 through 10 are cross-sectional views illustrating a method of manufacturing the semiconductor package 10 of FIG. 1, according to an embodiment of the inventive concept.

Figure 2:
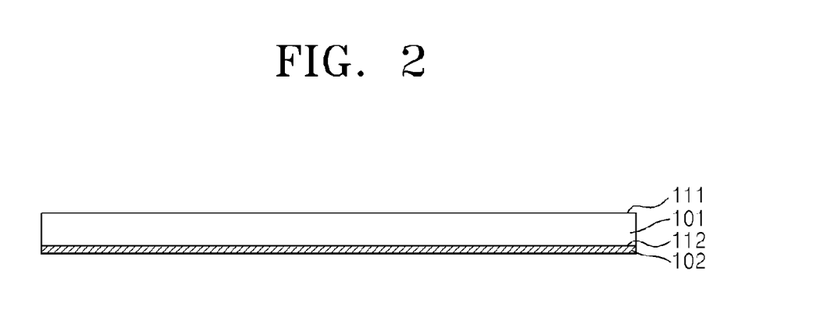
FIGS. 2 through 10 are cross-sectional views illustrating a method of manufacturing the semiconductor package of FIG. 1, according to an embodiment of the inventive concept.

Referring to FIG. 2, the base substrate 101 including the first surface 111 and the second surface 112 which are opposite to each other is provided. The adhesive layer 102 is formed on the second surface 112 of the base substrate 101.

Figure 3:
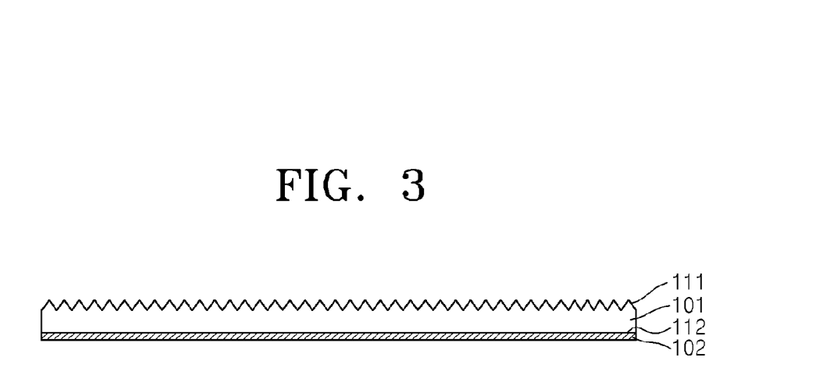
Figure 4:
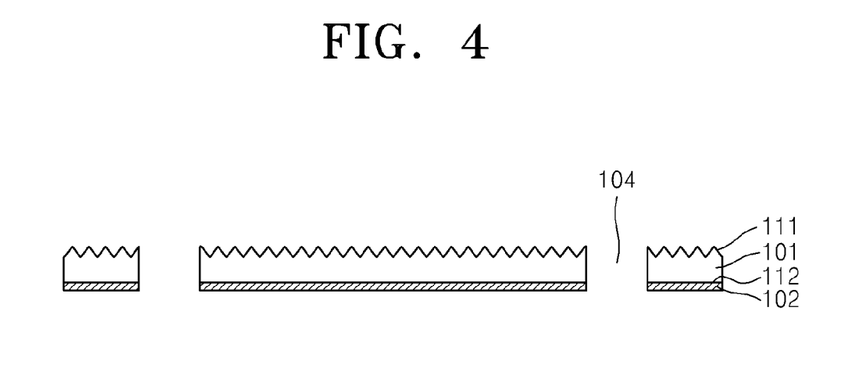

Referring to FIG. 3, the concave-convex portion is formed on the first surface 111 of the base substrate 101. The concave-convex portion may be formed by using, for example, sand grinding, sand blasting, chemical etching, dry etching using plasma, punching, stepping, laser beam machining, or the like. In sand grinding, a surface of an object is ground with a hard material. In sand blasting, fine diamond powder is propelled against a surface of an object at high speed. In chemical etching, a chemical solution is used to dissolve a surface. Each of a depth, a width, and/or a pitch of the concave-convex portion may range from about 1 μm to about 10 μm, but the present embodiment is not limited thereto. The concave-convex portion improves an adhesive force between the semiconductor chip 107 and the base substrate 101. Referring to FIG. 4, through-holes 104 passing through the base substrate 101 and the adhesive layer 102 are formed. The through-holes 104 are formed by using, for example, etching or ultraviolet (UV) laser drilling. In accordance with an embodiment of the inventive concept, the through-holes 104 have circular shapes or polygonal shapes.

Figure 5:
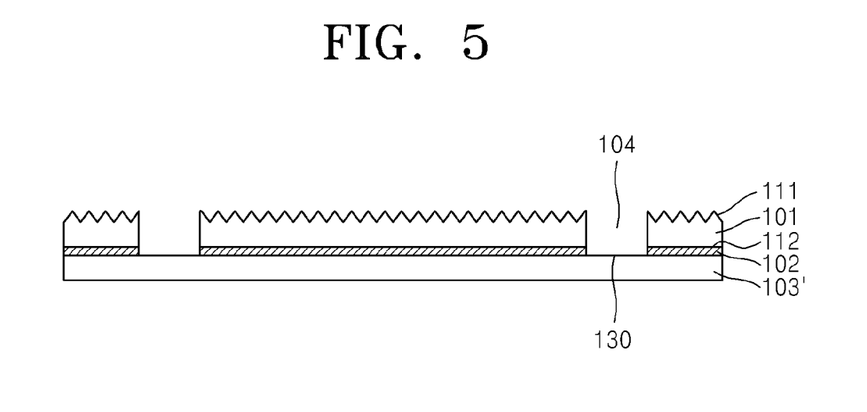

Referring to FIG. 5, a conductive layer 103' is formed on the second surface 112 of the base substrate 101. The conductive layer 103' has the exposed portions 130 exposed through the through-holes 104. The conductive layer 103' includes a conductive material, for example, a metal. The conductive layer 103' is a layer on which a pattern is formed. Alternatively, the conductive layer 103' is formed by attaching a layer having a small thickness, such as a foil, to the second surface 112 of the base substrate 101. The conductive layer 103' may be formed of, for example, a copper foil.

Figure 6:
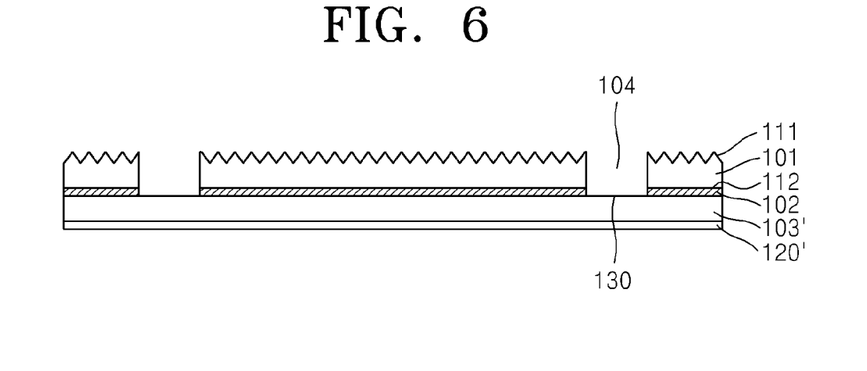

Referring to FIG. 6, a mask layer 120' is formed on the conductive layer 103'. The mask layer 120' is, for example, a photoresist layer or a hard mask layer.

Figure 7:
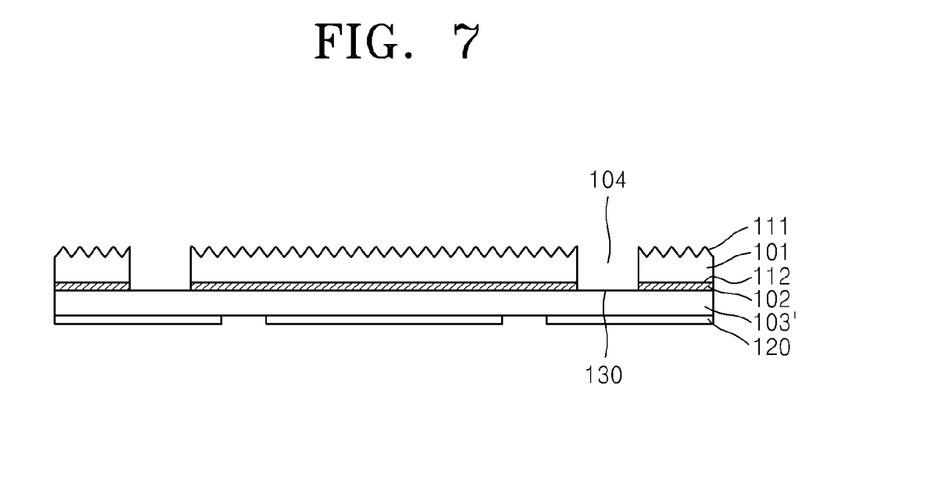

Referring to FIG. 7, mask patterns 120 are formed by patterning the mask layer 120'. If the mask layer 120' is a photoresist layer, the mask patterns 120 are formed by exposing the mask layer 120' to UV light and developing the mask layer 120'.

Figure 8:
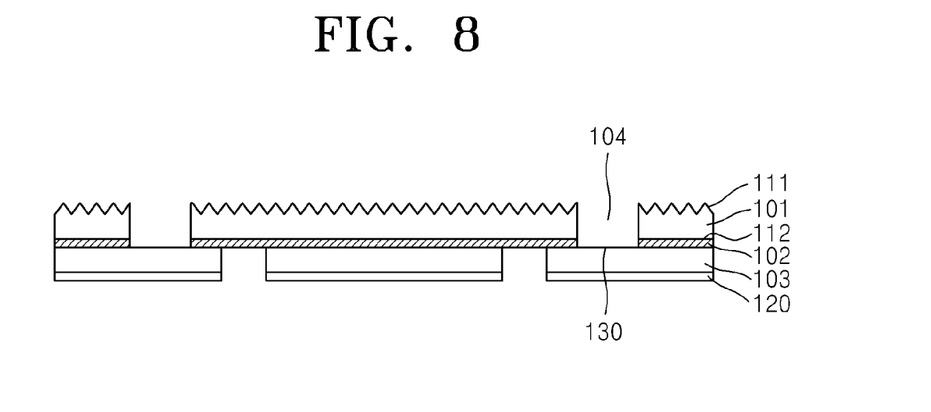

Referring to FIG. 8, the conductive layer 103' is etched by using the mask patterns as etch masks, and thus the wiring layer 103 having a predetermined pattern is formed on the adhesive layer 102. The wiring layer 103 has exposed portions 130 exposed through the through-holes 104.

Figure 9:
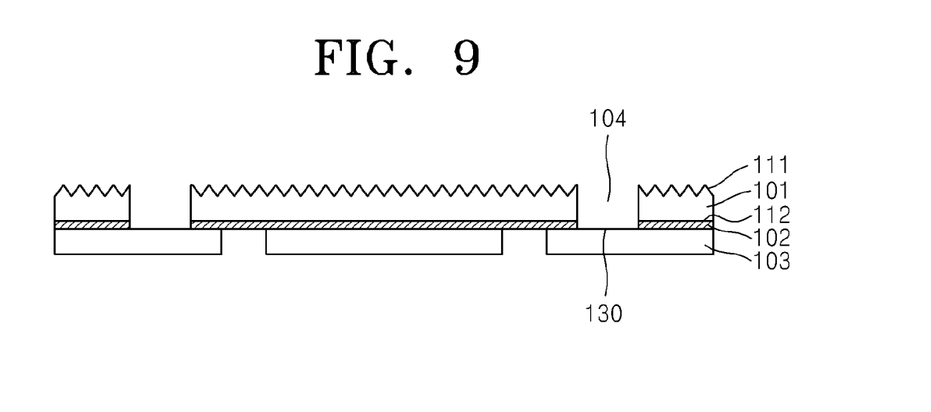

Referring to FIG. 9, the mask patterns 120 are removed. Accordingly, the base substrate 101, the adhesive layer 102, and the wiring layer 103, which are laminated, are formed.

Figure 10:
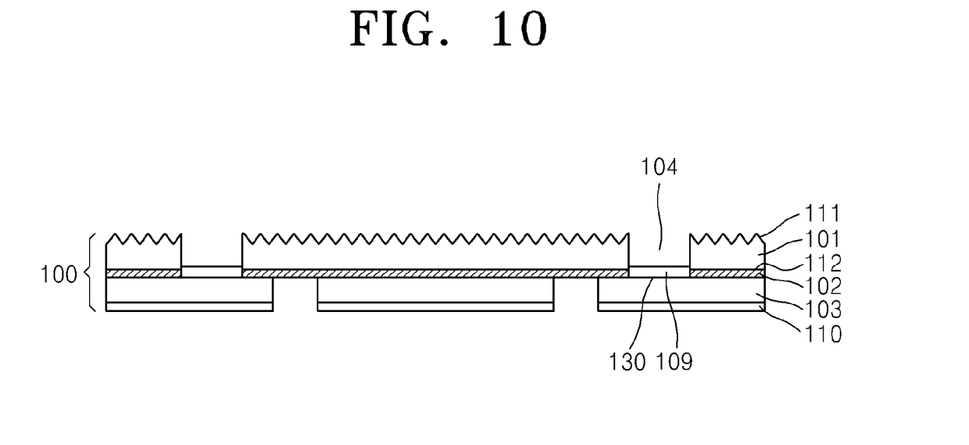

Referring to FIG. 10, the pads 109 and the contact pins 110 are formed on the wiring layer 103. The pads 109 are formed on a surface of the wiring layer 103 close to the base substrate 101. The pads 109 are formed on the exposed portions 130 of the wiring layer 103 exposed through the through-holes 104. The contact pins 110 are formed on another surface of the wiring layer 103 opposite to that on which the pads 109 are formed. In accordance with an embodiment of the inventive concept, the contact pins 110 are formed on parts of the other surface of the wiring layer 103. The pads 109 and the contact pins 110 are formed by using, for example, deposition, electroplating, or electroless plating. The pads 109 and the contact pins 110 are formed in the same process, or in different processes.

Next, the semiconductor chip 107 is attached to the first surface 111 of the base substrate 101 by using the adhesive member 106. As described above, since the first surface 111 has the concave-convex portion, there is a larger contact area between the adhesive member 106 and the first surface 111 than if the first surface 111 were smooth, thereby providing a greater adhesive force between the base substrate 101 and the semiconductor chip 107. The adhesive member 106 may have fluidity, and may fill in the concave-convex portion by flowing along the concave-convex portion formed on the first surface 111.

Next, the electrical connection members 108 for electrically connecting the chip pads 113 of the semiconductor chip 107 and the wiring layer 103 are formed. The electrical connection members 108 may be, for example, bonding wires. Next, the protective layer 105 that selectively covers the semiconductor chip 107 and/or the electrical connection members 108 is formed.

Figure 11:
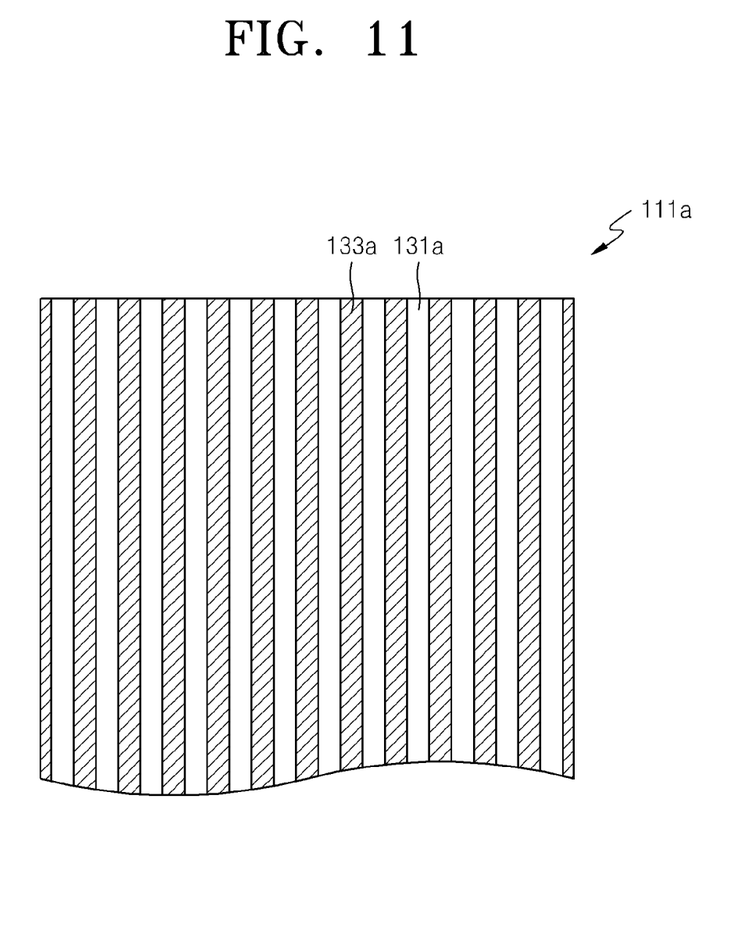
FIGS. 11 through 13 are plan views illustrating a first surface of a base substrate of the semiconductor package of FIG. 1, according to embodiments of the inventive concept.
Figure 12:
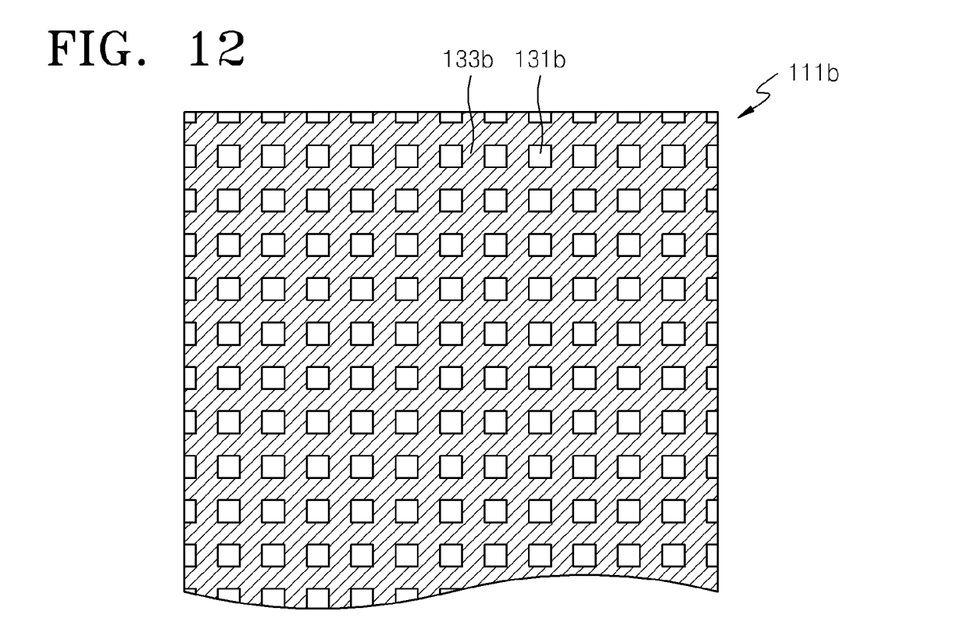
Figure 13:
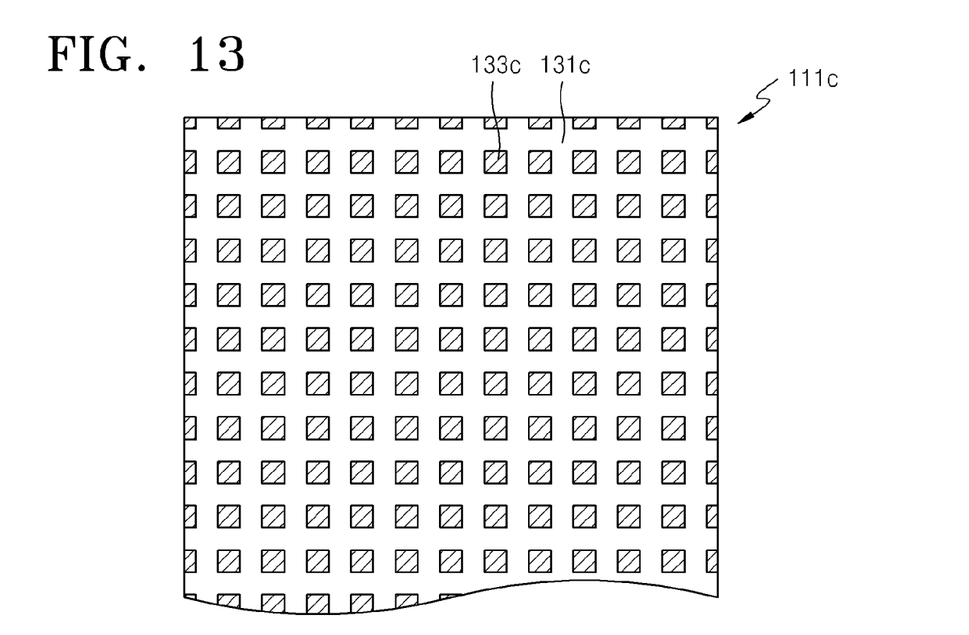

FIGS. 11 through 13 are plan views illustrating the first surface 111 of the base substrate 101 of FIG. 1, according to embodiments of the inventive concept.

Referring to FIG. 11, a first surface 111a includes projecting portions 131a and recessed portions 133a which have linear shapes extending in a direction. The adhesive member 106 (see FIG. 1) flows along the recessed portions 133a, and is uniformly applied to the first surface 111a.

Referring to FIG. 12, a first surface 111b includes projecting portions 131b and a recessed portion 133b forming a mesh shape. The recessed portion 133b extends to surround the projecting portions 131b, and the projecting portions 131b each have an island shape isolated by the recessed portion 133b. The adhesive member 106 (see FIG. 1) flows along the recessed portion 133b, and is uniformly applied to the first surface 111b. Although the projecting portions 131b have a quadrangular shape in FIG. 12, the present embodiment is not necessarily limited thereto.

Referring to FIG. 13, a first surface 111c includes a projecting portion 131c and recessed portions 133c having a mesh shape. The first surface 111c of FIG. 13 has a shape obtained by inverting a shape of the first surface 111b of FIG. 12. The projecting portion 131c extends to surround the recessed portions 133c, and the recessed portions 133c each have an island shape isolated by the projecting portion 131c. Although the recessed portion 133c has a quadrangular shape in FIG. 13, the present embodiment is not necessarily limited thereto.

Figure 14:
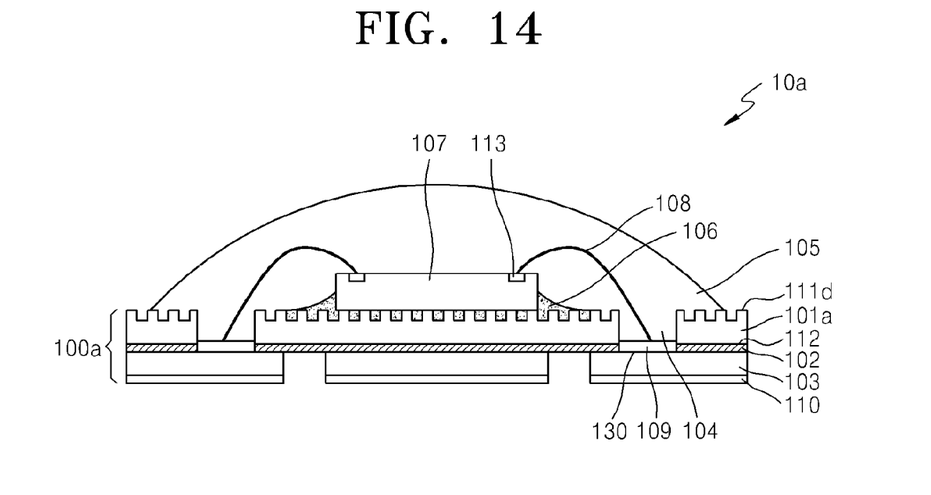
FIGS. 14 through 18 are cross-sectional views illustrating semiconductor packages according to embodiments of the inventive concept.
Figure 15:
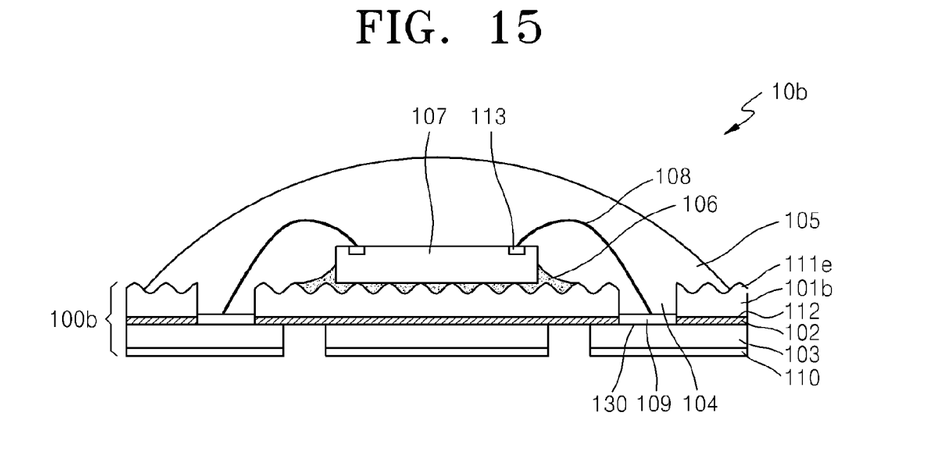
Figure 16:
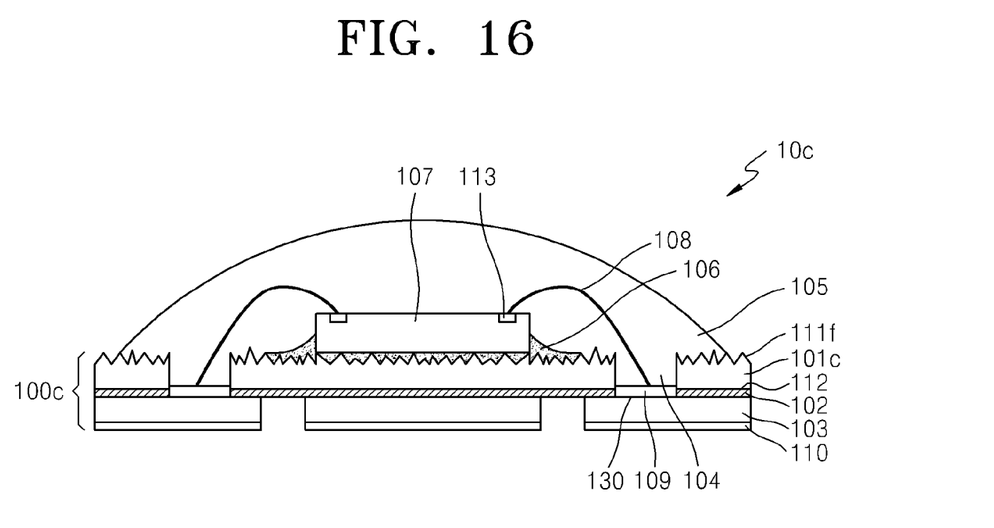

FIGS. 14 through 16 are cross-sectional views illustrating semiconductor packages 10a, 10b, and 10c according to embodiments of the inventive concept. FIGS. 14 through 16 illustrate the first surfaces 111d, 111e and 111f of the base substrate 101, according to embodiments of the inventive concept.

Referring to FIG. 14, the semiconductor package 10a includes a PCB 100a and the semiconductor chip 107 mounted on the PCB 100a. The PCB 100a includes the first surface 111d of the base substrate 101a having a quadrangular concave-convex portion. The quadrangular shape may be a rectangular shape or a regular square shape.

Referring to FIG. 15, the semiconductor package 10b includes a PCB 100b and the semiconductor chip 107 mounted on the PCB 100b. The PCB 100b includes the first surface 111e of the base substrate 101 having a semicircular concave-convex portion.

Referring to FIG. 16, the semiconductor package 10c includes a PCB 100c and the semiconductor chip 107 mounted on the PCB 100c. The PCB 100c includes the first surface 111f of the base substrate 101 having an irregular concave-convex portion.

Combinations of the embodiments of FIGS. 11 through 13 with the embodiments of FIGS. 14 through 16 are also included in the technical scope of the inventive concept.

Figure 17:
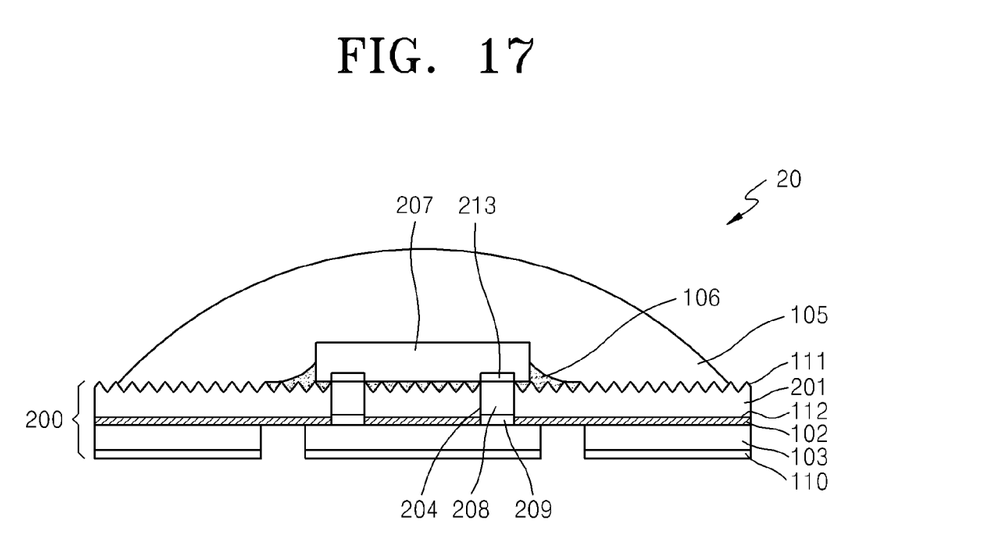
Figure 18:
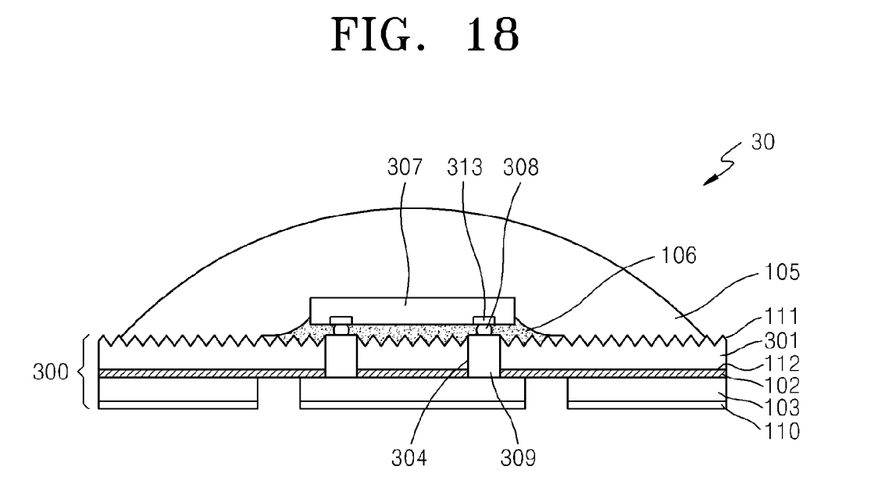

FIGS. 17 and 18 are cross-sectional views illustrating semiconductor packages 20 and 30 according to embodiments of the inventive concept. FIGS. 17 and 18 illustrate alternatives to the electrical connection members 108 of FIG. 1, according to embodiments of the inventive concept.

Referring to FIG. 17, the semiconductor package 20 includes a PCB 200 and a semiconductor chip 207 mounted on the PCB 200. The PCB 200 includes a base substrate 201, the adhesive layer 102, the wiring layer 103, and the contact pins 110. The base substrate 201 includes the first surface 111 having a concave-convex portion. The base substrate 201 includes through-holes 204 formed directly under the semiconductor chip 207. Pads 209 are disposed in the through-holes 204 on the wiring layer 103. Accordingly, the pads 209 are disposed directly under the semiconductor chip 207. The semiconductor chip 207 includes chip pads 213 formed in lower portions of the semiconductor chip 207. The PCB 200 and the semiconductor chip 207 are electrically connected to each other through electrical connection members 208. That is, the pads 209 of the PCB 200 and the chip pads 213 of the semiconductor chip 207 are electrically connected to each other through the electrical connection members 208. The electrical connection members 208 are disposed in the base substrate 201 and on the pads 209. The electrical connection members 208 are plugs that fill in the through-holes 204 of the base substrate 201. In accordance with an embodiment of the inventive concept, the pads 209 and the electrical connection members 208 are integrally formed with each other.

Referring to FIG. 18, the semiconductor package 30 includes a PCB 300 and a semiconductor chip 307 mounted on the PCB 300. The PCB 300 includes a base substrate 301, the adhesive layer 102, the wiring layer 103, and the contact pins 110. The base substrate 301 includes the first surface 111 having a concave-convex portion. The base substrate 301 has through-holes 304 directly formed under the semiconductor chip 307. Pads 309 are disposed in the through-holes 304 on the wiring layer 103. Also, the pads 309 are plugs that fill in the through-holes 304 of the base substrate 301. The semiconductor chip 307 includes chip pads 313 formed in lower portions of the semiconductor chip 307. The PCB 300 and the semiconductor chip 307 are electrically connected to each other through electrical connection members 308 such as solder balls. That is, the pads 309 of the PCB 300 and the chip pads 313 of the semiconductor chip 307 are electrically connected to each other through the electrical connection members 308. The electrical connection members 308 are disposed on the pads 309.

A method of manufacturing a PCB according to an embodiment of the inventive concept includes providing a base substrate, forming a concave-convex portion on a first surface of the base substrate, forming an adhesive layer on a second surface of the base substrate opposite to the first surface, forming through-holes passing through the base substrate and the adhesive layer, and forming a wiring layer on the adhesive layer, the wiring layer having exposed portions exposed through the through-holes. A semiconductor chip is mounted on a part of the first surface of the base substrate by using an adhesive member to attach the semiconductor chip to the base substrate.

The concave-convex portion is formed by processing the first surface of the base substrate by using sand grinding, sand blasting, or erosion.

The forming of the wiring layer on the adhesive layer includes forming a conductive layer on the adhesive layer, forming a mask layer on the conductive layer, exposing and developing the mask layer to form mask patterns, etching the conductive layer using the mask patterns as etch masks to form the wiring layer, and removing the mask patterns.

In accordance with an embodiment of the inventive concept, after the forming of the conductive layer on the adhesive layer, the method further includes performing electroplating on the conductive layer to form pads on the exposed portions of the conductive layer exposed through the through-holes.

A wire bonding process is used to electrically connect the semiconductor chip to the wiring layer.

The base substrate includes, for example, polyethylene naphthalate (PEN).

The first surface of the base substrate may have a zigzag shape, a square wave shape, a sine wave shape, or an irregular shape. A flexible printed circuit board (FPCB), comprises a substrate having a first surface with scratches formed thereon, a metal wiring layer disposed on a second surface of the substrate opposite to the first surface, and an adhesive layer interposed between the substrate and the metal wiring layer, wherein via holes penetrate the substrate and the adhesive layer, so that a portion of the metal wiring layer is exposed by the via holes. A chip to be mounted is attachable to the substrate through an adhesive agent to be coated on a portion of the first surface of the substrate.

The FPCB further includes pads formed on the surface of the metal wiring layer exposed by the via holes, wherein the chip is electrically connected to the metal wiring layer through the pads.

The substrate includes, for example, polyethylene naphthalate (PEN).

The first surface of the substrate may have a zigzag shape, a square wave shape, a sine wave shape or an irregular shape.

Figure 19:
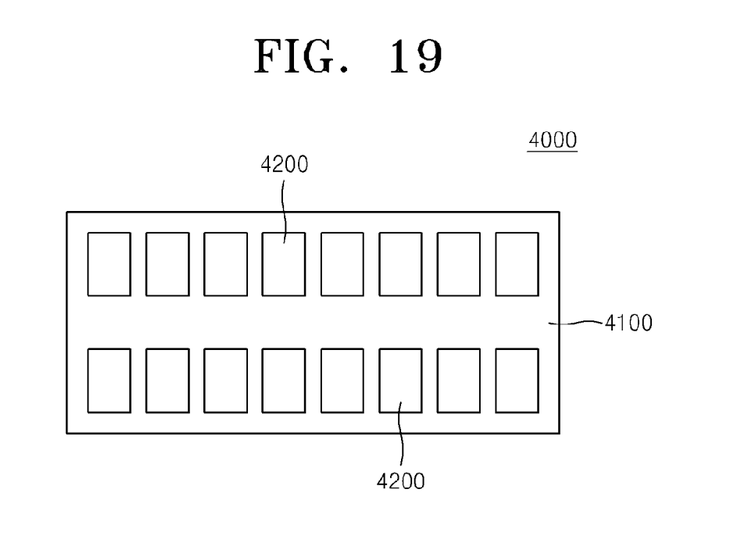
FIG. 19 is a plan view illustrating a memory module including a semiconductor device, according to an embodiment of the inventive concept.

FIG. 19 is a plan view illustrating a memory module 4000 including a semiconductor device, according to an embodiment of the inventive concept.

Referring to FIG. 19, the memory module 4000 includes a PCB 4100 and a plurality of semiconductor packages 4200. The PCB 4100 may be any of the PCBs 100, 100a, 100b, 100c, 200 and 300 of the above embodiments. The plurality of semiconductor packages 4200 may include the semiconductor packages 10, 10a, 10b, 10c, 20, and 30 of the above embodiments. The memory module 4000 may be a single in-lined memory module (SIMM) having the plurality of semiconductor packages 4200 mounted on only one surface of the PCB 4100, or a dual in-lined memory module (DIMM) having the plurality of semiconductor packages 4200 mounted on at least two surfaces of the PCB 4100. Also, the memory module 4000 of FIG. 19 may be a fully buffered DIMM including advanced memory buffers (AMBs) for respectively providing external signals to the plurality of semiconductor packages 4200. Also, the memory module 4000 of FIG. 19 may be a tape package.

Figure 20:
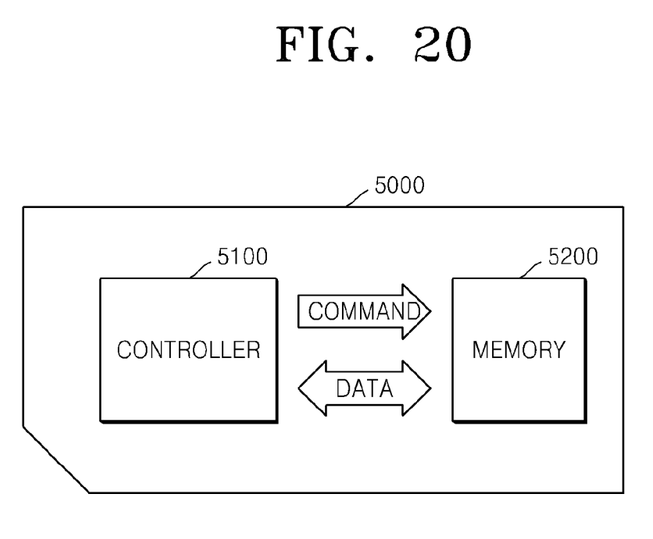
FIG. 20 is a block diagram illustrating a memory card according to an embodiment of the inventive concept.

FIG. 20 is a block diagram illustrating a memory card 5000 according to an embodiment of the inventive concept.

Referring to FIG. 20, a controller 5100 and a memory 5200 are disposed to send/receive electric signals to/from each other. For example, when the controller 5100 gives a command to the memory 5200, the memory 5200 sends data. The controller 5100 and/or the memory 5200 includes semiconductor packages according to at least one embodiment of the inventive concept. The memory 5200 includes a memory array (not shown) or a memory array bank (not shown). The memory card 5000 is used in memory devices as, for example, a memory stick card, a smart media (SM) card, a secure digital (SD) card, a mini SD card, or a multi media card (MMC).

Figure 21:
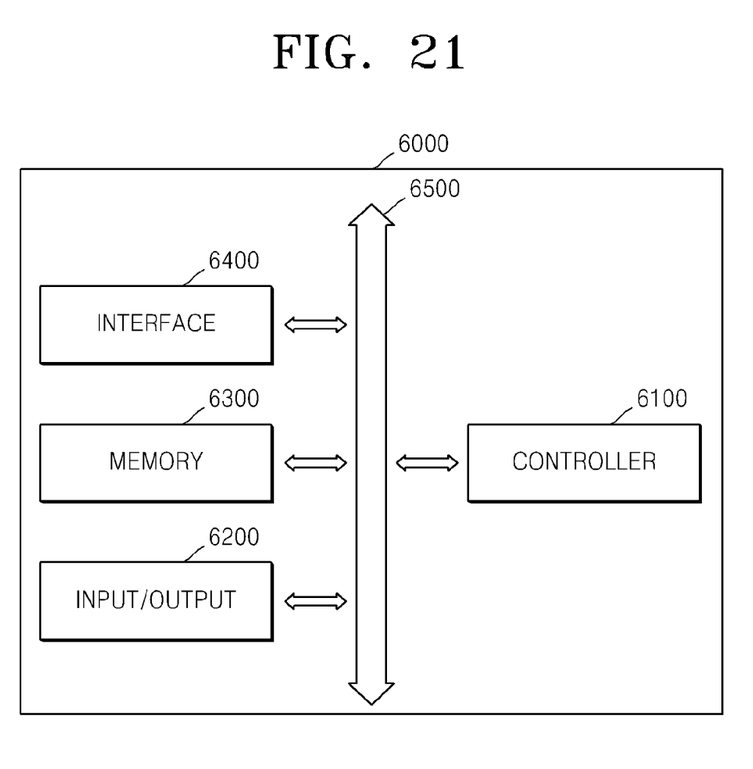
FIG. 21 is a block diagram illustrating a system according to an embodiment of the inventive concept.

FIG. 21 is a block diagram illustrating a system 6000 including a nonvolatile memory device, according to an embodiment of the inventive concept.

Referring to FIG. 21, the system 6000 includes a controller 6100, an input/output device 6200, a memory 6300, and an interface 6400. The system 6000 may be a mobile system or a system that transmits or receives data. The mobile system may be a personal digital assistant (PDA), a portable computer, a web tablet, a wireless phone, a mobile phone, a digital music player, or a memory card. The controller 6100 executes a software program and controls the system 6000. The controller 6100 may be a microprocessor, a digital signal processor, a microcontroller, or the like. The input/output device 6300 is used to input or output data of the system 6000. The system 6000 is connected to an external apparatus, for example, a personal computer or a network, by using the input/output device 6200, to send/receive data to/from the external apparatus. The input/output device 6200 may be a keypad, a keyboard, or a display. The memory 6300 stores codes and/or data for operating the controller 6100 and/or stores data processed by the controller 6100. The controller 6100 and/or the memory 6300 includes semiconductor packages according to at least one embodiment of the inventive concept. The interface 6400 is a data transmission path between the system 6000 and an external apparatus. The controller 6100, the input/output device 6200, the memory 6300, and the interface 6400 communicate with one another by a bus 6500. For example, the system 6000 may be used for a mobile phone, an MP3 player, a navigation system, a portable multimedia player (PMP), a solid state disk (SSD), or a household appliance.

Figure 22:
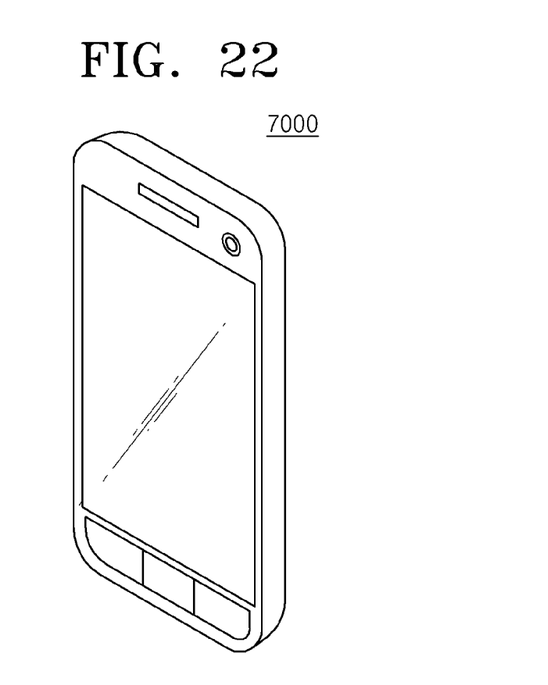
FIG. 22 is a perspective view illustrating an electronic device to which a semiconductor device manufactured according to an embodiment of the inventive concept may be applied.

FIG. 22 is a perspective view illustrating an electronic device 7000 to which a semiconductor device manufactured according to an embodiment of the inventive concept may be applied.

Referring to FIG. 22, the electronic system 6000 of FIG. 21 is applied to a mobile phone 7000. In addition, the electronic system 6000 of FIG. 21 may be applied to, for example, a portable laptop computer, an MP3 player, a navigation system, an SSD, a vehicle, or a household appliance.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A semiconductor package comprising:
   a printed circuit board; and
   a semiconductor chip mounted on the printed circuit board, wherein the printed circuit board comprises:
   a base substrate comprising a first surface and a second surface which are positioned opposite to each other, and comprising through-holes, wherein the first surface includes a concave-convex portion;
   an adhesive layer disposed on the second surface of the base substrate;
   a wiring layer attached to the second surface of the base substrate by the adhesive layer and comprising exposed portions exposed through the through-holes;
   an adhesive member disposed on the first surface of the base substrate and adhering the semiconductor chip to the first surface;
   electrical connection members electrically connecting the wiring layer with the semiconductor chip; and
   pads disposed on the exposed portions of the wiring layer and electrically connected to the electrical connection members.

2. The semiconductor package of claim 1, wherein the electrical connection members include bonding wires that electrically connect the semiconductor chip to the pads.

3. The semiconductor package of claim 1, wherein the electrical connection members include plugs disposed on the pads and filling in the through-holes.

4. The semiconductor package of claim 1, wherein the pads are plugs filling in the through-holes.

5. The semiconductor package of claim 4, wherein the electrical connection members include solder balls that electrically connect the pads with the semiconductor chip.

6. The semiconductor package of claim 1, wherein the concave-convex portion has a regular shape or an irregular shape.

7. The semiconductor package of claim 1, wherein the concave-convex portion has at least one of a triangular shape, a semicircular shape, a zigzag shape, a square wave shape, and a sine wave shape.

8. The semiconductor package of claim 1, wherein the concave-convex portion has a linear shape.

9. The semiconductor package of claim 1, wherein the concave convex portion has a mesh shape.

10. The semiconductor package of claim 1, wherein the concave convex portion has an island shape.

11. The semiconductor package of claim 1, wherein the adhesive member covers at least a part of a side surface and a lower surface of the semiconductor chip.

12. The semiconductor package of claim 1, further comprising a protective layer covering the semiconductor chip and the electrical connection members.

13. The semiconductor package of claim 1, wherein the printed circuit board is a flexible printed circuit board.

14. A printed circuit board comprising:
- a base substrate comprising a first surface and a second surface which are positioned opposite to each other, and comprising through-holes, wherein the first surface includes a concave-convex portion;
- an adhesive layer disposed on the second surface of the base substrate;
- a wiring layer attached to the second surface of the base substrate by the adhesive layer and comprising exposed portions exposed through the through-holes; and
- pads disposed on the exposed portions of the wiring layer.

* * * * *